US006967792B2

(12) United States Patent
Weber et al.

(10) Patent No.: US 6,967,792 B2
(45) Date of Patent: Nov. 22, 2005

(54) APPARATUS FOR POSITIONING AN OPTICAL ELEMENT IN A STRUCTURE

(75) Inventors: Ulrich Weber, Ulm (DE); Hubert Holderer, Koenigsbronn (DE); Dirk Rexhaeuser, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 3 days.

(21) Appl. No.: 10/458,968

(22) Filed: Jun. 11, 2003

(65) Prior Publication Data

US 2003/0231412 A1 Dec. 18, 2003

(30) Foreign Application Priority Data

Jun. 14, 2002 (DE) ................................ 102 26 655

(51) Int. Cl.[7] .............................................. G02B 7/02
(52) U.S. Cl. ...................... 359/819; 359/811; 359/813; 359/821; 359/822
(58) Field of Search ................................ 359/819, 619, 359/811, 813, 821, 823, 822

(56) References Cited

U.S. PATENT DOCUMENTS

| 5,909,324 A | * | 6/1999 | Bryant et al. ................ 359/822 |
| 6,163,417 A | * | 12/2000 | Nunnally ..................... 359/822 |
| 6,538,829 B2 | * | 3/2003 | Rau et al. .................... 359/811 |
| 6,571,041 B2 | * | 5/2003 | Bourcier et al. .............. 385/52 |
| 6,754,013 B2 | * | 6/2004 | Willis ......................... 359/819 |

FOREIGN PATENT DOCUMENTS

| DE | 199 01 295 A1 | 7/2000 | |
| WO | WO 99/66361 | 12/1999 | ............ G02B 7/00 |

* cited by examiner

Primary Examiner—Ricky L. Mack
Assistant Examiner—Brandi Thomas
(74) Attorney, Agent, or Firm—Welsh & Katz, Ltd.

(57) ABSTRACT

In an apparatus for positioning an optical element in a structure, particularly in an objective housing of a projection objective for microlithography, the optical element is connected to the structure via fastening elements. The position of the optical element is set by means of adjusting fasteners. The fastening elements are arranged in such a way and the adjusting fasteners can be actuated in such a way that the optical element can be tilted about three mutually independent axes and can additionally be displaced in a translatory fashion in one axial direction.

25 Claims, 7 Drawing Sheets

APPARATUS FOR POSITIONING AN OPTICAL ELEMENT IN A STRUCTURE

BACKGROUND OF THE INVENTION

1. Field of the Invention

The invention relates to an apparatus for positioning an optical element in a structure, the optical element being connected to the structure via fastening elements, and it being possible to set the position of the optical element by means of adjusting elements. The invention relates, in particular, to a projection objective for microlithography, a beam splitter cube being provided as optical element.

2. Description of the Related Art

Manufacturing and assembly tolerances that lead to aberrations in the objective inevitably occur during the assembly of optical imaging apparatuses, for example a projection objective for microlithography. It is known for the purpose of compensating these tolerances to reposition one or more optical elements appropriately in the objective. The same also holds for optical elements that need to be adjusted very exactly in the beam path.

It is known from DE 199 01 295 A1, for example, to displace one or more optical elements relative to the optical axis in order to compensate manufacturing and assembly tolerances and to correct aberrations.

WO 99/66361 discloses a positioning device for a lens, three degrees of freedom being present for positioning the lens.

SUMMARY OF THE INVENTION

It is an object of the present invention to provide an apparatus for positioning an optical element in a structure, in particular an optical element in an objective housing of a projection objective, that permits very exact positionings and adjustments in the beam path.

This object is achieved according to the invention by virtue of the fact that the fastening elements are arranged in such a way and the adjusting fasteners can be adjusted in such a way that the optical element can be tilted about three mutually independent axes (x-, y-, z-axis) and can additionally be displaced in a translatory fashion in one axial direction (z-axis).

The positioning apparatus according to the invention therefore has a total of four degrees of freedom, as a result of which an optical element to be positioned and/or to be adjusted can be aligned very precisely in multifarious ways.

This holds, for example, inter alia for a beam splitter cube in a projection objective. Whereas a light beam emanating from a light source, for example a laser, is deflected by the beam splitter cube after passing through a reticle, which represents the object, into a cantilever arm of the objective housing, the light beam subsequently returning from the cantilever arm is passed by the beam splitter cube in the direction of the imaging plane, specifically a wafer.

Since, now, the beam splitter layer in the beam splitter surface in the beam splitter cube functions as a deflecting mirror for the light beam coming from the reticle, the beam splitter cube must be capable of being adjusted by two tilt axes that define the plane of the beam splitter layer, in order to be able to compensate angular errors between the optical axis in the beam path from reticle to beam splitter cube and the optical axis in the beam path of the cantilever.

The external surfaces are to be as perpendicular as possible to the optical axes of the beam path so that in this case the light beam at the external surfaces, for example the top side, front side and the rear side, of the beam splitter cube is not too strongly deflected. In order, now, also to be able to adjust the external surfaces to the optical axes, there is a need for a fine adjustment about an axis of rotation and/or a tilt axis perpendicular to the plane of the beam splitter layer and/or to the beam splitter surface.

So that, now, the light beam impinging from the reticle on the beam splitter cube is deflected exactly onto the optical axis of the beam path in the cantilever, the plane of the beam splitter layer must be situated exactly at the point of intersection of the optical axes of the reticle beam path and cantilever beam path. In order to be able to position the beam splitter layer exactly at the point of intersection, it must additionally be possible to finely adjust the beam splitter cube in a translatory fashion perpendicular to the plane of the beam splitter layer.

According to the invention, the above named positionings and adjustments can be achieved with the aid of the inventive arrangement and configuration of the fastening elements and adjusting elements.

In a preferred refinement, it can be provided in this case that a) the fastening elements in each case block the translation along one axis, and all the axes of the translations blocked by the fastening elements lie in a plane that is defined by the tilt axes along which the optical element cannot be displaced in a translatory fashion, b) the axes of the translations blocked by the fastening elements lie perpendicular to the axial direction in which the optical element can be displaced in a translatory fashion, and c) the axes of the translations blocked by the fastening elements intersect one another at a point on an axis along which the optical element can be displaced in a translatory fashion.

In addition, it is possible in this case for the axes of the translations blocked by the fastening elements to intersect one another at a point on an axis along which the optical element can be displaced in a translatory fashion and which goes through the point of intersection of the two tilt axes along which the optical element cannot be displaced in a translatory fashion.

With a beam splitter cube as optical element, the beam splitter surface on the beam splitter cube is in this case the plane in which the axes of the translations blocked by the fastening elements advantageously lie. The optical axis along which the translatory displacement is to be performed is in this case an axis that is perpendicular to the beam splitter surface. The origin of the coordinate system is likewise located in this case on the plane of the beam splitter surface at the point of intersection of the optical axis of the reticle beam path with the optical axis of the cantilever beam path. The three tilt axes advantageously intersect one another in this case at the origin of the coordinate system.

When the optical element is a mirror or a lens, the above named plane in which the axes of the translations blocked by the fastening elements lie advantageously contains the vertex of the surface of the mirror or of the lens. One possibility for using the solution according to the invention would be, for example, an elliptic mirror or a kidney-shaped mirror. The same holds for mirrors or lenses that are provided with a corrective aspheric.

Advantageous developments and refinements of the invention emerge from the remaining subclaims and from the exemplary embodiment described below in principle with the aid of the drawings.

DETAILED DESCRIPTION

Figure 1:
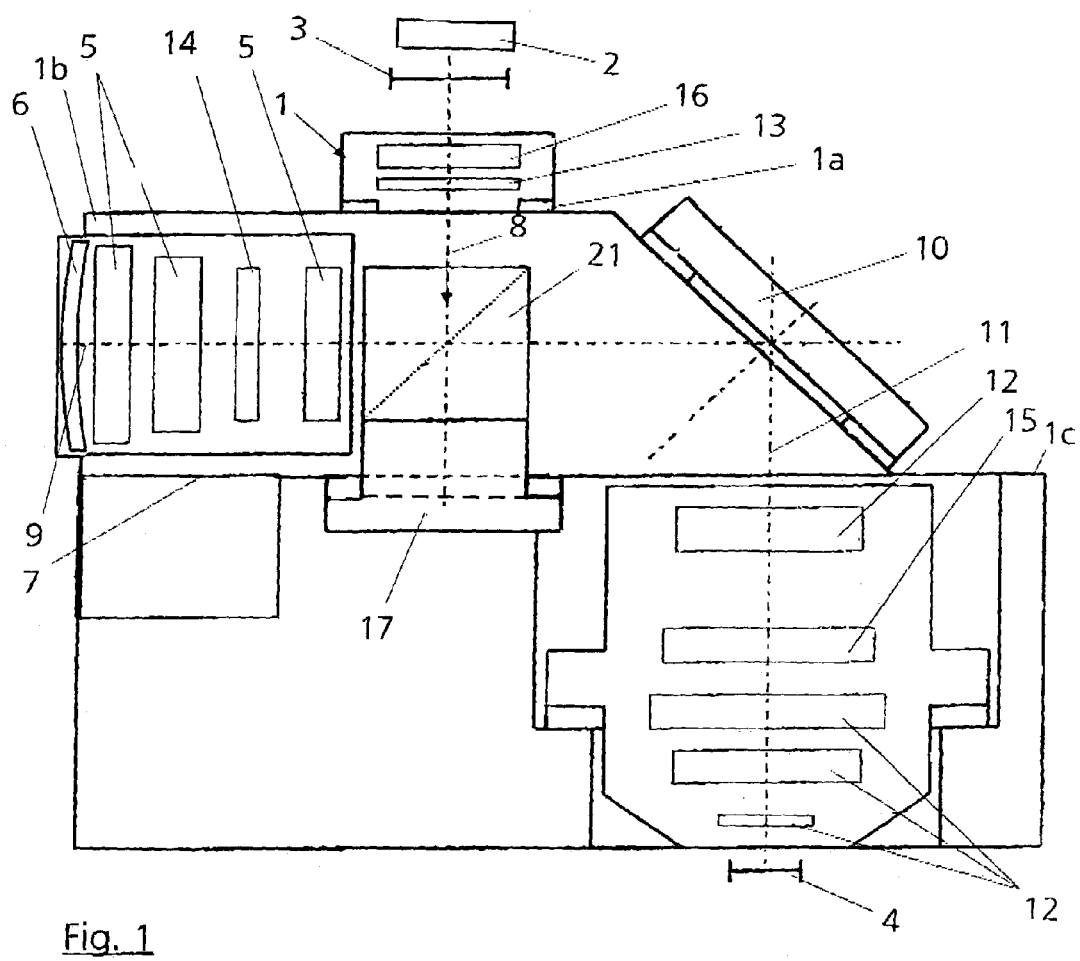
FIG. 1 shows an illustration of the principle with the mode of operation of a projection objective for microlithography.

FIG. 1 illustrates the principle of a projection exposure machine having a projection objective 1 for microlithography for the purpose of producing semiconductor elements.

It has an illumination system 2 with a laser (not illustrated) as light source. Located in the object plane of the projection exposure machine is a reticle 3, whose structure is to be imaged on a correspondingly reduced scale onto a wafer 4 that is arranged beneath the projection objective 1 and is located in the image plane.

The projection objective 1 is provided with a first vertical objective part 1a and a second horizontal objective part 1b. Located in the objective part 1b are a plurality of lenses 5 and a concave mirror 6, which are arranged in an objective housing 7 of the objective part 1b. A beam splitter cube 21 is provided for deflecting the projection beam (see arrow) from the vertical objective part 1a with a vertical optical axis 8 into the horizontal objective part 1b with a horizontal optical axis 9.

After reflection of the beams at the concave mirror 6 and subsequent passage through the beam splitter cube 21, these strike a deflecting mirror 10. At the deflecting mirror 10, the horizontal beam path 9 is reflected, in turn, into a vertical optical axis 11. A third vertical objective part 1c with a further lens group 12 is located beneath the deflecting mirror 10. Three λ/4 plates 13, 14 and 15 are further additionally located in the beam path. The λ/4 plate 13 is located in the projection objective 1 between the reticle 3 and the beam splitter cube 21 behind a lens or lens group 16. The λ/4 plate 14 is located in the beam path of the horizontal objective part 1b, and the λ/4 plate 15 is located in the third objective part 1c. The three λ/4 plates serve the purpose of completely rotating the polarization once, resulting, inter alia, in minimization of beam losses.

The individual optical axes of the projection objective 1 are certainly adjusted very exactly to one another during construction of the objective such that they run with satisfactory accuracy parallel or perpendicular to one another, but owing to tolerance inaccuracies, or else to faults that still occur during operation, it is not always possible to achieve an alignment of the optical elements with the accuracy required for the applications envisaged, and this leads to a corresponding worsening of the imaging quality.

Consequently, for the purpose of raising the imaging quality, measures need to be taken in order, in an appropriate way, exactly to position and to adjust optical elements in the projection objective 1 that are suitable therefor. Suitable, inter alia, for this purpose is the beam splitter cube 21 which is provided to this end with an adjusting and setting device 17 that is described in more detail below.

The beam splitter cube 21 of FIG. 1 provided with the adjusting and setting device 17 can be seen in FIGS. 2 to 9 in an enlarged illustration with fastening elements 22 and adjusting fasteners 23. The fastening elements 22 and the adjusting fasteners 23, which are connected on one side to the beam splitter cube 21, make the connection between the beam splitter cube 21 and a fixed holding frame 24 that is connected (in a way not illustrated in more detail) to the objective housing of the projection objective 1.

The aim now is for it to be possible to tilt the beam splitter cube 21 relative to the fixed holding frame 24 about three mutually independent axes, and to be able to displace it in terms of one direction in a translatory or linear fashion. For this purpose, the origin 25 of the coordinate system x, y, z lies on the beam splitter surface or beam splitter plane 26. In this case, the x-axis 27 is located parallel to the longitudinal axis of the beam splitter cube 21 in the beam splitter plane 26, the y-axis 28 is located perpendicular to the x-axis 27, likewise in the beam splitter plane 26, and the z-axis 29 is located perpendicular to the beam splitter plane 26.

In order to be able to adjust the beam splitter cube 21, it must be possible to tilt it about the x-axis 27, the y-axis 28 and the z-axis 29, and to displace it along the z-axis 29.

As may be seen, the beam splitter cube 21 is provided with two fastening elements 22 that are located in the corner regions of a longitudinal edge of the beam splitter cube 21. The two adjusting fasteners 23 are located in the corner regions of the longitudinal edge of the beam splitter cube 21, which is situated opposite the longitudinal edge with the two fastening elements 22. Of course, the arrangement of the fastening elements 22 and the adjusting elements 23 is to be regarded only as an example. In particular, the adjusting elements 23 can also be provided at another location.

Figure 4:
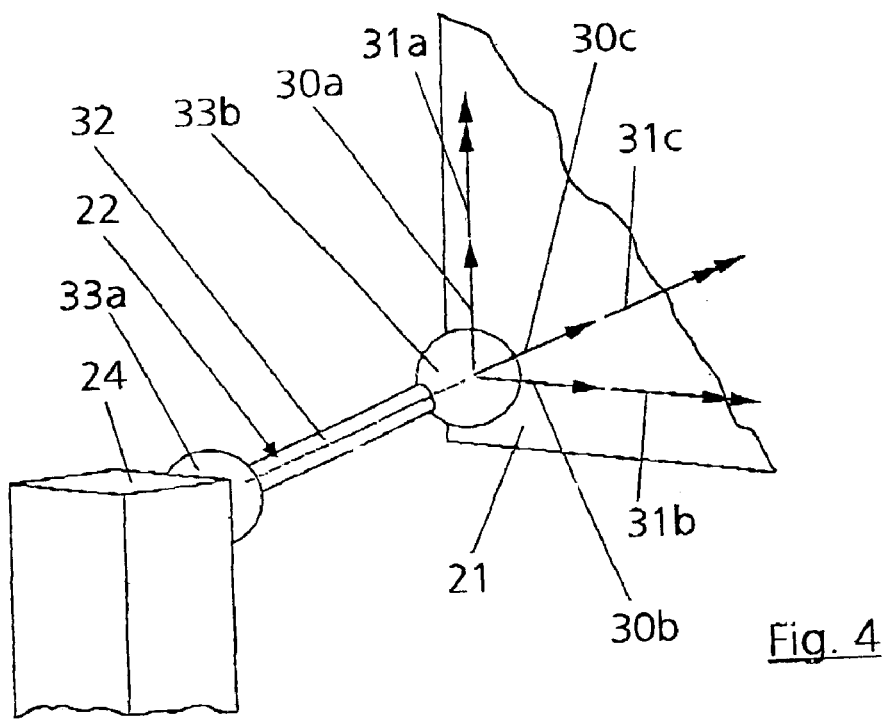
FIG. 4 shows an enlarged perspective illustration of a fastening element.

As may be seen from the enlarged illustration in FIG. 4, each fastening element 22 has two translational mobilities 30a and 30b and three rotational mobilities 31a, 31b and 31c. The configuration of the fastening element 32 with a long rod 32 and a spherical joint 33a and 33b fitted in each case at the rod end fixes the third linear possibility 30c of displacement or translation, which runs in the direction of the longitudinal axis of the long rod 32. The two spherical joints 33a and 33b result in an articulated connection or suspension of the beam splitter cube 21. Of course, the fastenings by means of the spherical joints 33a and 33b are to be regarded only as exemplary. If required, it is possible for this purpose also to provide solid joints such as, for example, devices of the leaf spring type having appropriate elasticity.

Figure 2:
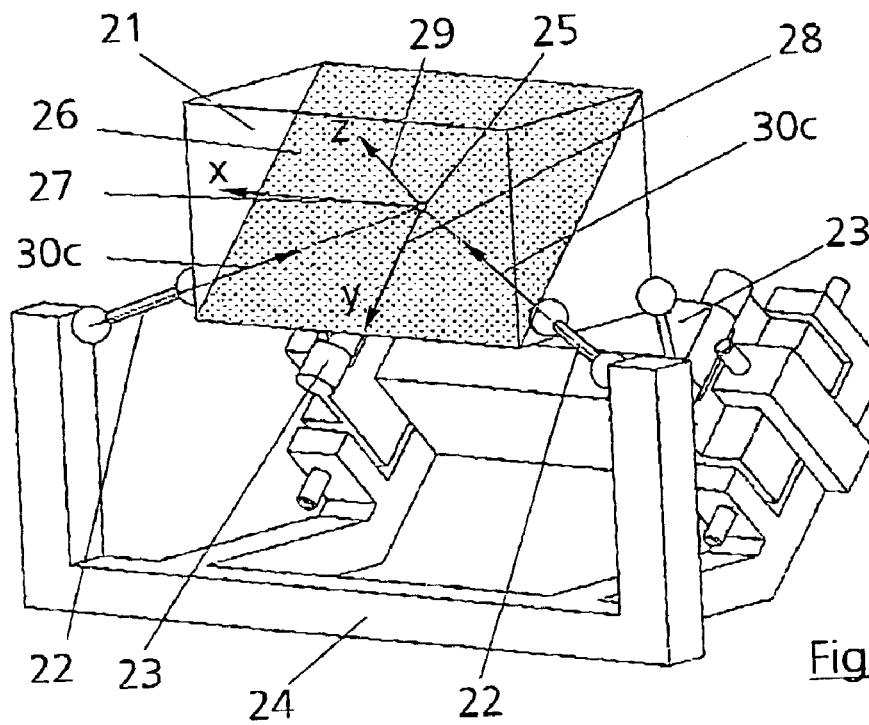
FIG. 2 shows an enlarged perspective illustration of a beam splitter cube provided with an adjusting and setting device and having a holding frame, from the side.
Figure 3:
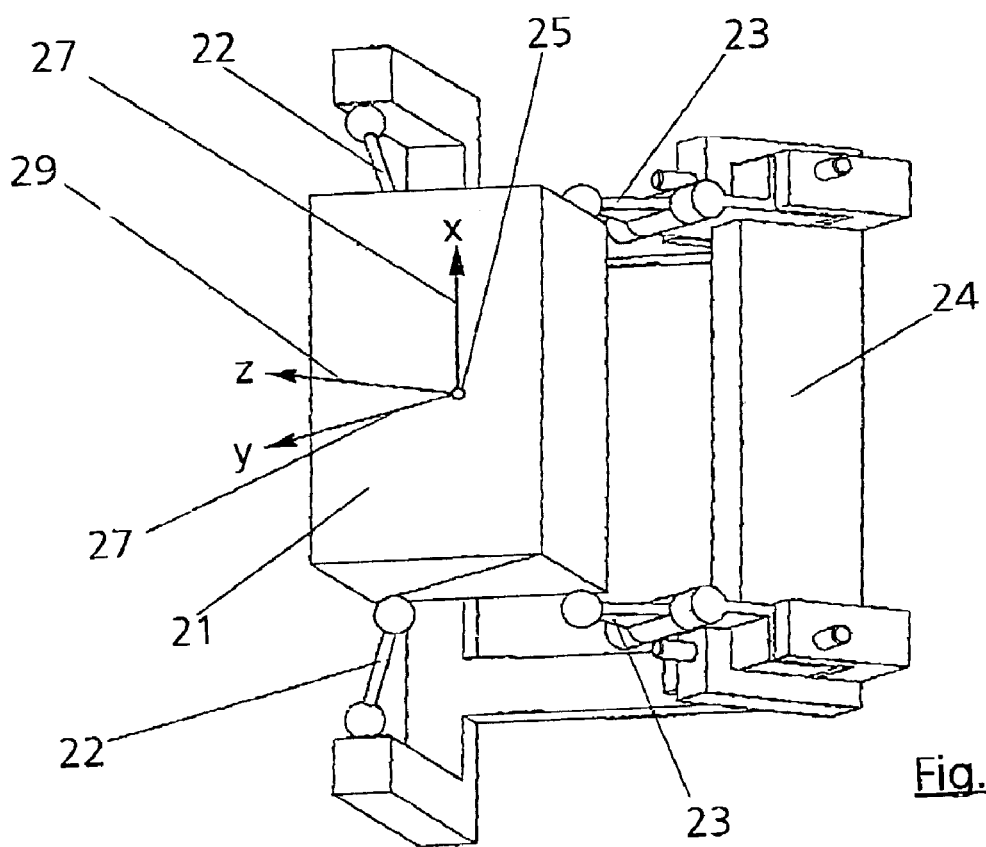
FIG. 3 shows the beam splitter cube according to FIG. 2 in a perspective illustration from above.

Since the beam splitter cube 21 is to be displaced along the z-axis 29, which represents the optical axis between the reticle 3 and the beam splitter cube 21, the fastening elements 22 are arranged such that the direction of the fixed translation possibility 30c is oriented perpendicular to the z-axis 29 (see FIG. 2).

In order to permit tilting about the x-axis 27 in the beam splitter plane 26, the fixed translation possibilities 30c of all the fastening elements 22 must lie in the plane that is defined by the x tilt axis 27 and the y tilt axis 28. Since the plane defined by the x-axis 27 and the y-axis 28 is identical in the case of the present exemplary embodiment to the beam splitter plane 26, the fixed translation possibilities 30c of the fastening elements 22 likewise lie in the beam splitter plane 26.

In order to permit tilting about the z-axis 29, all the fixed translation possibilities 30c of the fastening elements 22 must also intersect the z-axis 29. It may be seen from FIG. 2 that the extensions of the longitudinal axes of the long rods 32 of the fastening elements 22 thereby meet or intersect one another at the point of intersection of the coordinate system 25, which is located in the plane of the beam splitter plane 26.

When, as in the case of the exemplary embodiment illustrated, the beam splitter cube 21 is moved and/or manipulated by two adjusting fasteners 23, the adjusting fasteners 23 have one translational mobility 34a and three rotational mobilities 35a, 35b, 35c, while the translation possibilities 34b and 34c are held still via adjusting elements still to be discussed (and illustrated in FIG. 5, for example by the adjusting screws 40a, 40b, 40c, 40d) in the adjusting fasteners 23. By actuating the adjusting elements, the adjusting fasteners 23 can be adjusted in the translation directions 34b and 34c, it thereby being possible to displace and tilt the beam splitter cube 21 in the desired way.

Figure 5:
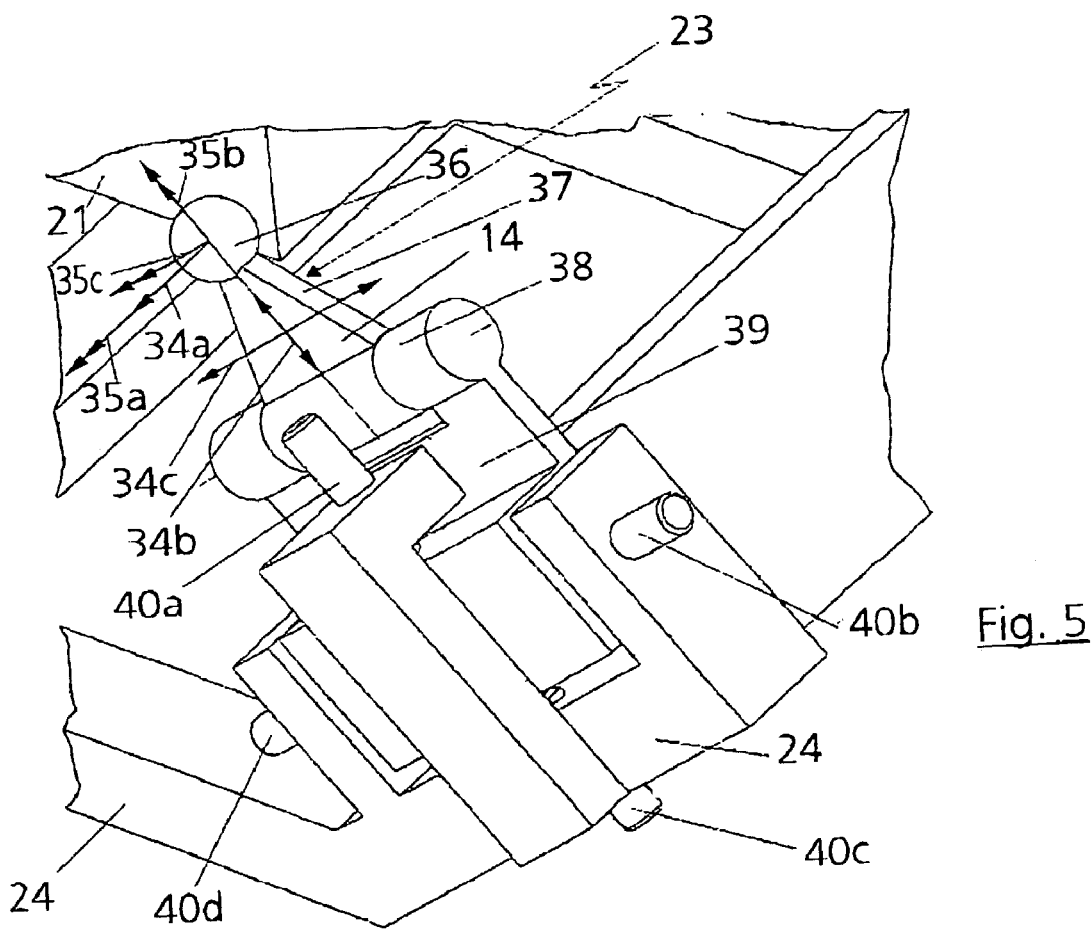
FIG. 5 shows an enlarged perspective illustration of an adjusting fastener.

An example of such an adjusting fastener 23 is further illustrated in FIG. 5. It has a spherical joint 36 that connects the beam splitter cube 21 to a triangular plate 37. Located at the base of the triangular plate 37 is a hinge 38 with an appended sliding piece 39 that is guided in one direction in the holding frame 24. With the aid of adjusting elements in the form of adjusting screws 40a, 40b, 40c, 40d, the sliding piece 39 can be displaced in a linear or translatory fashion relative to the holding frame 24 in the mutually perpendicular translational mobilities 34c and 34b.

Instead of two adjusting fasteners 23 with in each case two adjusting elements, it is also possible as an alternative to use four adjusting fasteners with in each case one adjusting element, in this case each adjusting fastener then needing to have two translational mobilities and three rotational mobilities, and it being possible for the third translation mobility to be adjusted by an adjusting element (not illustrated).

Imagining away the fastening elements 22 in the system composed of beam splitter cube 21, fixed holding frame 24, adjusting fasteners 23 and fastening elements 22, it is possible for the beam splitter cube 21 to move in two degrees of freedom relative to the holding frame 24 without actuating the adjusting elements in the adjusting fasteners 23.

The adjusting fasteners 23 must be arranged such that these two degrees of freedom cannot coincide with the tiltings about the x-axis 27, the y-axis 28 and the z-axis 29 and the translatory displacement along the z-axis 29 or with a combination of these movements, so that forces and torques that act in these directions of movement can be supported.

Figure 6:
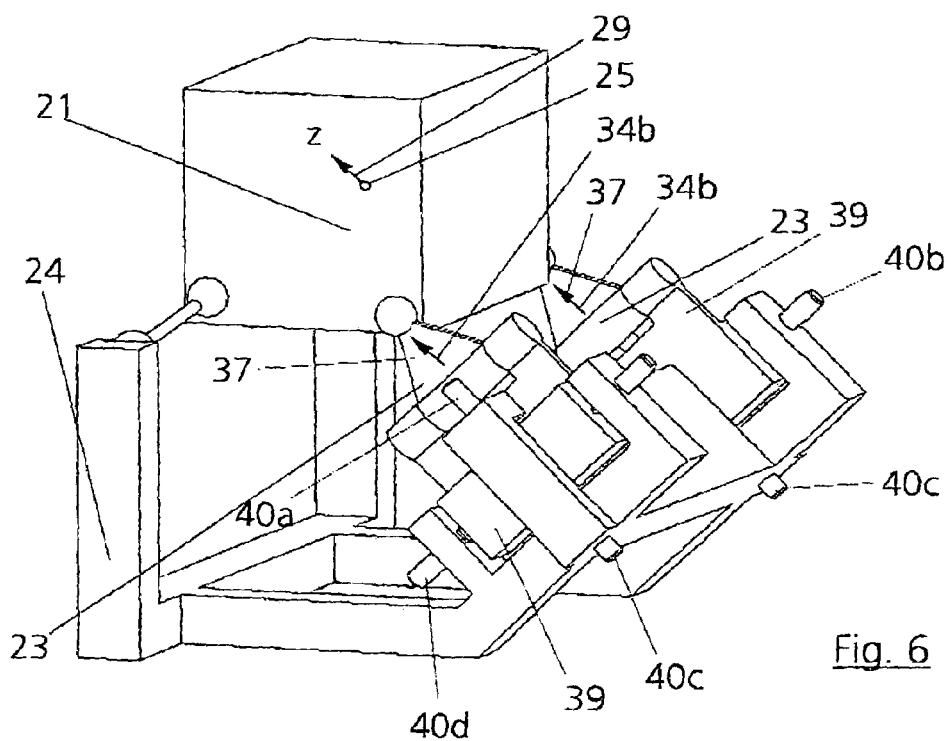
FIG. 6 shows a perspective illustration with a translatory displacement.

It can be seen from FIG. 6 how the beam splitter cube 21 can be displaced along the z-axis 29 when the adjusting fasteners 23 are displaced in the same sense in direction 34b with the aid of the adjusting elements, specifically the adjusting screws 4(a and 40c. The adjusting screws 40a and 40c must be adjusted correspondingly in each case for this purpose.

Figure 7:
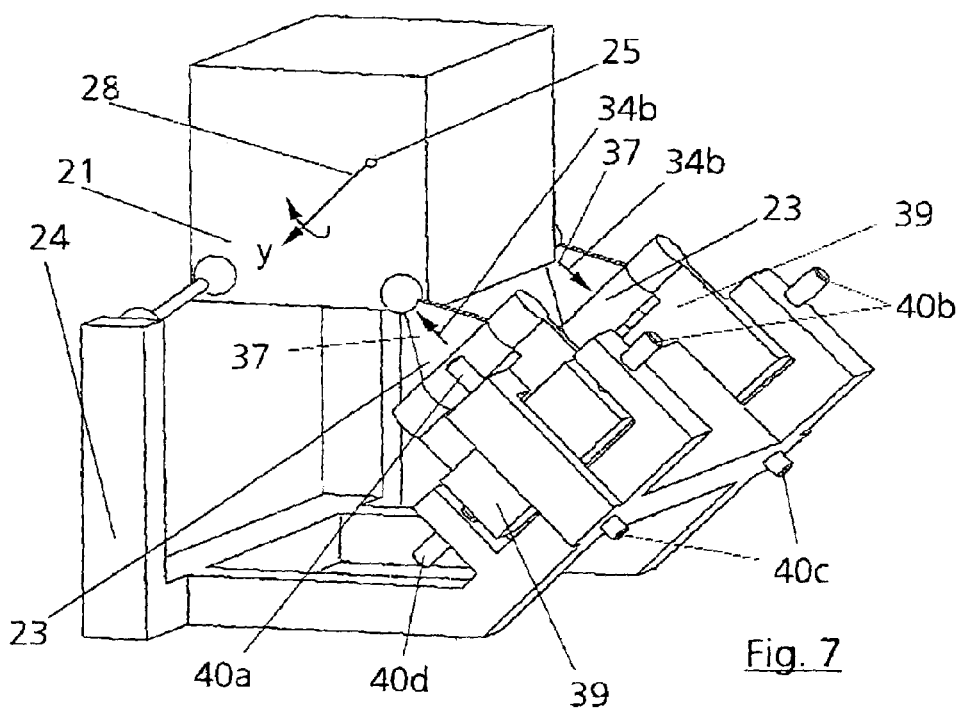
FIGS. 7 to 9 show illustrations of various tilting possibilities.

If the two adjusting fasteners 23 are displaced in the opposite sense in direction 34b (see arrows), this results in a tilt about the y-axis 28 for the beam splitter cube 21, as may be seen from FIG. 7.

Figure 8:
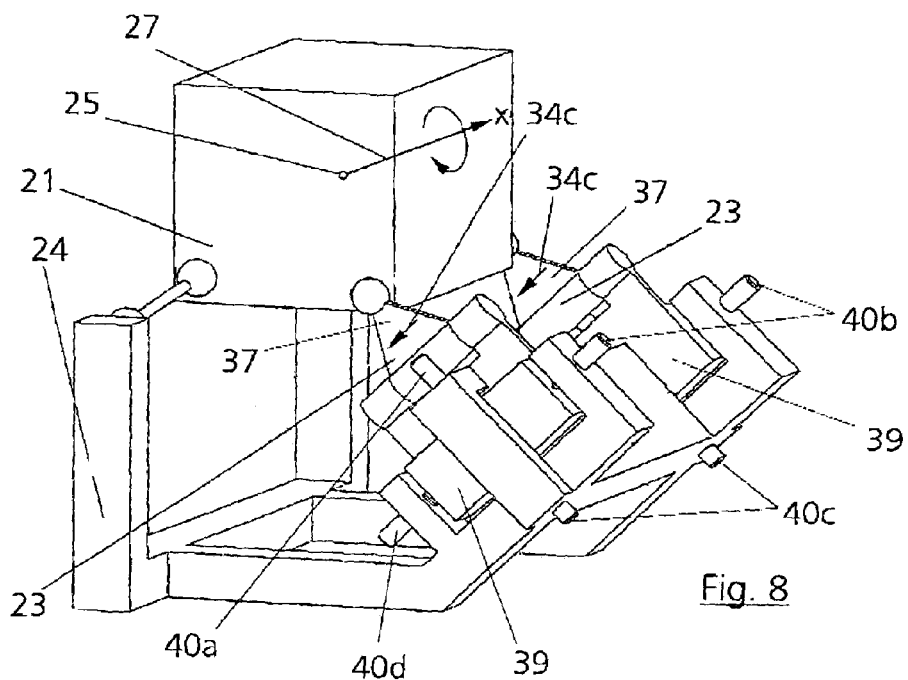

It can be seen from FIG. 8 that the beam splitter cube 21 is tilted about the x-axis 27 when both adjusting fasteners 23 are displaced in the same sense in direction 34c. The adjusting elements, specifically the adjusting screws 40b and 40d, are actuated as appropriate for this purpose.

Figure 9:
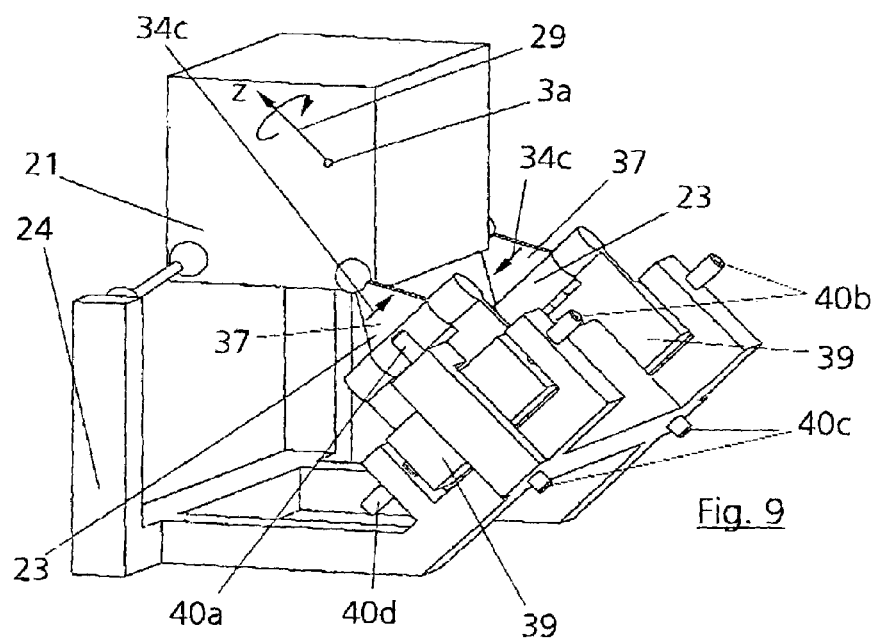

In order to achieve a tilt of the beam splitter cube 21 about the z-axis 29, the two adjusting fasteners 23 must be displaced in the opposite sense in direction 34c, as is illustrated by the arrows in FIG. 9.

The adjusting fasteners 23 or the adjusting elements can be adjusted by hand, by motor, pneumatically, hydraulically, electromagnetically, piezoelectrically, or magnetostrictively.

Figure 10:
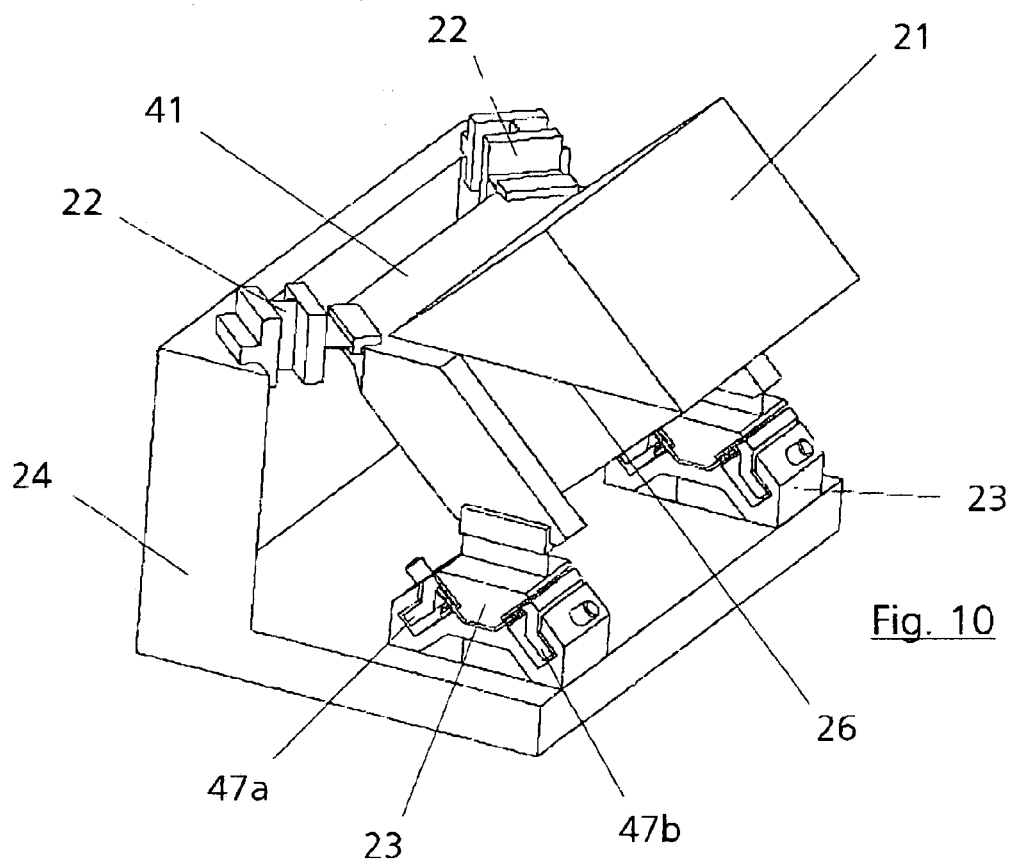
FIG. 10 shows an embodiment with a bearing frame.

FIG. 10 shows an exemplary embodiment of the apparatus with a bearing frame 41 and fastening elements 22 and adjusting fasteners 23, in the case of which the joints are designed as solid or spring joints.

The beam splitter cube 21 is mounted in the bearing frame 41, which is borne in the holding frame 24 by the fastening elements 22 and the adjusting fasteners 23.

The beam splitter layer 26 can be seen as a line on the beam splitter cube 21.

Figure 11:
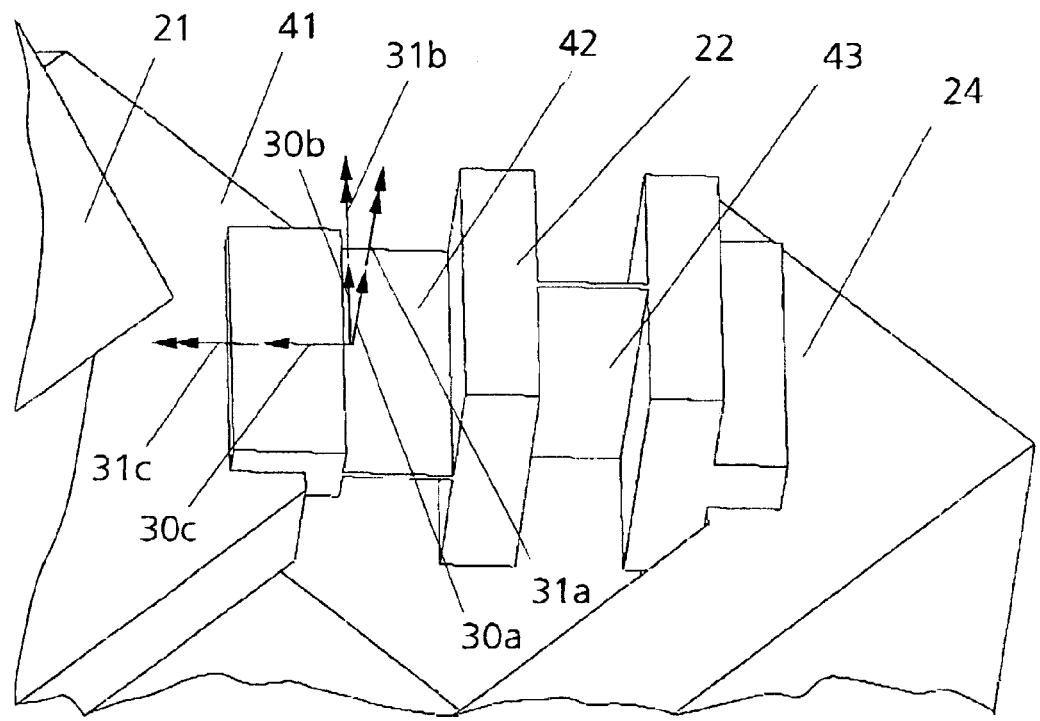
FIG. 11 shows an enlarged illustration of a fastening element according to FIG. 10.

A fastening element 22 in accordance with FIG. 10 may be seen in an enlarged illustration in FIG. 11. It connects the bearing frame 41, in which the beam splitter cube 21 is mounted, to the holding frame 24.

By bending a leaf spring joint 42, the contact of the fastening element 22 with the bearing frame 41 has a translational mobility along the axis 30a, and a rotational mobility about the axis 31b.

By bending a leaf spring joint 43, the contact of the fastening element 22 has a translational mobility along the axis 30b and a rotational mobility about the axis 31a.

Torsion of the leaf spring joints 43 results in a rotational mobility about the axis 31c for the contact of the fastening element 22 with the bearing frame 41, as a result of which the fastening element with the leaf spring joints 42 and 43 has the same mobilities as the fastening element assembled from the long rod 32 and the two spherical joints 33a and 33b (see FIG. 4). The fastening element 22 is stiff in a translatory fashion only along the axis 30c.

Figure 12:
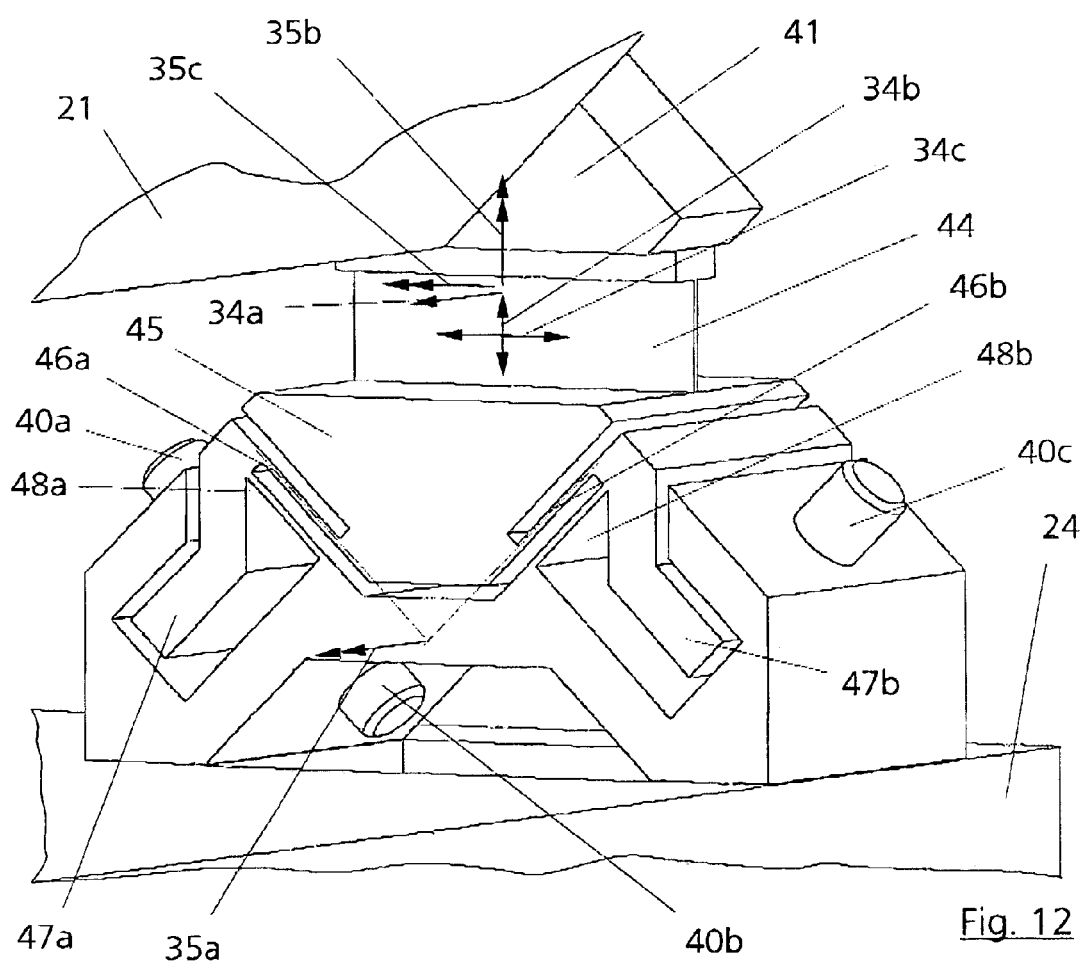
FIG. 12 shows an enlarged illustration of an adjusting fastener according to FIG. 10.

An adjusting fastener 23 in accordance with FIG. 10 is shown in FIG. 12 with solid joints in an enlarged illustration. By bending a leaf spring 44, the contact of the adjusting fastener 23 with the bearing frame 41 obtains a translational mobility along the axis 34a and a rotational mobility about the axis 35c.

The contact of the adjusting fastener 23 with the bearing frame 41 acquires a rotational mobility about the axis 35b by torsion of the leaf spring 44.

In order to obtain a rotational mobility about the axis 35a like the adjusting fastener (see FIG. 5) formed from the spherical joint 36, the triangular plate 37 and the hinge 38, a block 45 adjoining the leaf spring 44 (the component analogous to the sliding piece 39 of the exemplary embodiment already described) is mounted via leaf springs 46a and 46b on control levers 47a and 47b such that, with the control levers 47a and 47b fixed, an instantaneous center of rotation with the axis of rotation 35a results at the point of intersection of the extensions of the leaf springs 46a and 46b.

One control lever 47a is mounted via a leaf spring 48a in the part of the adjusting fastener 23 permanently connected to the holding frame 24.

The control lever 47a can be adjusted with the aid of the adjusting screws 40a and 40b, the leaf spring 46a transmitting the adjustment onto the block 45 and thereby initiating a movement of the bearing frame 41 and the beam splitter cube 21.

One control lever 47b is similarly mounted via a leaf spring 48b in the part of the adjusting fastener 23 permanently connected to the holding frame 24.

The control lever 47b can be adjusted with the aid of the adjusting screws 40c and 40d (adjusting screw 40d not being visible since it is covered. It presses with respect to the adjusting screw 40c onto the control lever 47b.), the leaf spring 46b transmitting the adjustment to the block 45 and a movement of the bearing frame 41 and the beam splitter cube 21 thereby being initiated.

Since, in the exemplary embodiment shown, the control levers 47a and 47b are rotated by 45° together with the leaf spring joints 46a, 46b, 48a, 48b relative to the displacement directions 34b and 34c, it is necessary in each case for two control levers to be actuated simultaneously in order to obtain a pure displacement along the direction of 34b or 34c.

The control levers 47a and 47b must be moved simultaneously inward or outward in order to displace the block 45.

One control lever must be moved inward and the other moved outward for a pure displacement of the block 45 along the axis 34c.

What is claimed is:

1. An apparatus for positioning an optical element in a structure, the optical element being connected to the structure via fastening elements, and it being possible to set the position of the optical element by means of adjusting fasteners, wherein said fastening elements are arranged in such a way and said adjusting fasteners can be adjusted in such a way that the optical element can be rotationally moved through three mutually independent axes and can additionally be displaced in a translatory fashion in one axial direction, and
    a) said fastening elements in each case block the translation along one axis, and all the axes of the translations blocked by said fastening elements lie in a plane that is defined by the tilt axes along which the optical element cannot be displaced in a translatory fashion,
    b) the axes of the translations blocked by said fastening elements lie perpendicular to the axial direction in which the optical element can be displaced in a translatory fashion, and
    c) the axes of the translations blocked by said fastening elements intersect one another at a point on an axis along which the optical element can be displaced in a translatory fashion.

2. The apparatus as claimed in claim 1, wherein the axes of the translations blocked by said fastening elements intersect one another at a point on an axis along which the optical element can be displaced in a translatory fashion and which goes through the point of intersection of the two tilt axes along which the optical element cannot be displaced in a translatory fashion.

3. The apparatus as claimed in claim 1, wherein the optical element is provided with at least two of said fastening elements and at least two of said adjusting fasteners.

4. The apparatus as claimed in claim 3, wherein two of said adjusting elements are provided for each said adjusting fastener.

5. The apparatus as claimed in claim 1, wherein said fastening elements and said adjusting fasteners are connected elastically to the optical element.

6. The apparatus as claimed in claim 5, wherein said fastening elements are connected to the optical element via solid joints.

7. The apparatus as claimed in claim 5, wherein said adjusting fasteners are connected to the optical element via solid joints.

8. The apparatus as claimed in claim 1, wherein said fastening elements and said adjusting fasteners are connected elastically to a bearing frame in which the optical element is mounted.

9. The apparatus as claimed in claim 8, wherein said fastening elements are connected to said bearing frame in which the optical element is mounted via solid joints.

10. The apparatus as claimed in claim 8, wherein said adjusting fasteners are connected to the bearing frame in which the optical element is mounted via solid joints.

11. The apparatus as claimed in claim 5, wherein said adjusting fasteners are stiff in two axial directions and can be adjusted in a plane formed from the two stiff axial directions.

12. The apparatus as claimed in claim 11, wherein said adjusting fasteners are provided with adjusting elements via which said adjusting fasteners can be displaced in each case in the directions of the two stiff axes.

13. The apparatus as claimed in claim 12, wherein said adjusting elements can be actuated independently of one another for the two stiff axes.

14. The apparatus as claimed in claim 1, wherein said optical element is a beam splitter cube.

15. The apparatus as claimed in claim 1, wherein said optical element is a beam splitter cube.

16. The apparatus as claimed in claim 15, wherein the plane in which the axes of the translations blocked by said fastening elements lie is the plane of the beam splitter surface of said beam splitter cube.

17. The apparatus as claimed in claim 14, wherein said fastening elements are arranged in the corner regions of said beam splitter cube.

18. The apparatus as claimed in claim 17, wherein said adjusting fasteners are arranged in the corner regions lying opposite said fastening elements.

19. The apparatus as claimed in claim 1, wherein a mirror is provided as optical element.

20. The apparatus as claimed in claim 1, wherein a lens is provided as optical element.

21. The apparatus as claimed in claims 14, wherein the plane in which the axes of the translations blocked by said fastening elements lie is a reference surface or optically used surface.

22. The apparatus as claimed in claim 1, wherein said structure is an objective housing of a projection objective for microlithography.

23. A projection objective for microlithography, comprising a plurality of optical elements arranged in an objective housing, at least one optical element being connected to the objective housing via fastening elements, and it being possible to set the position of the optical element by means of adjusting fasteners, wherein said fastening elements and said adjusting fasteners are arranged on the optical element, and can be actuated, in such a way that the optical element can be rotationally moved through three mutually independent axes and can additionally be displaced in a translatory fashion in one axial direction, and
    a) said fastening elements in each case block the translation along one axis, and all the axes of the translations blocked by said fastening elements lie in a plane that is defined by the tilt axes along which the optical element cannot be displaced in a translatory fashion,
    b) the axes of the translations blocked by said fastening elements lie perpendicular to the axial direction in which the optical element can be displaced in a translatory fashion, and c) the axes of the translations blocked by said fastening elements intersect one another at a point on an axis along which the optical element can be displaced in a translatory fashion.

24. The projection objective as claimed in claim 23, wherein the axes of the translations blocked by said fastening elements intersect one another at a point on an axis along which the optical element can be displaced in a translatory fashion and which goes through the point of intersection of the two tilt axes along which the optical element cannot be displaced in a translatory fashion.

25. The projection objective as claimed in claim 23, wherein a beam splitter cube is provided as optical element.

* * * * *

UNITED STATES PATENT AND TRADEMARK OFFICE
CERTIFICATE OF CORRECTION

PATENT NO.       : 6,967,792 B2
APPLICATION NO.  : 10/458968
DATED            : November 22, 2005
INVENTOR(S)      : Weber et al.

It is certified that error appears in the above-identified patent and that said Letters Patent is hereby corrected as shown below:

column 4, line 49:

".... spherical joints 33aand 33b ...." should read ".... spherical joints 33a and 33b ...."

column 4, line 51:

".... spherical joints 33a and 33bare ...." should read "....spherical joints 33a and 33b are ...."

column 5, line 60:

".... adjusting screws 4(a and 40c ...." should read "....adjusting screws 40a and 40c ...."

Signed and Sealed this

Twenty-ninth Day of August, 2006

JON W. DUDAS
*Director of the United States Patent and Trademark Office*